United States Patent
Strange

(10) Patent No.: US 6,574,462 B1
(45) Date of Patent: Jun. 3, 2003

(54) LOCAL OSCILLATOR APPARATUS FOR RADIO FREQUENCY COMMUNICATION SYSTEMS

(75) Inventor: Jonathan R. Strange, Reigate (GB)

(73) Assignee: Analog Devices, Inc., Norwood, CA (US)

( * ) Notice: Subject to any disclaimer, the term of this patent is extended or adjusted under 35 U.S.C. 154(b) by 0 days.

(21) Appl. No.: 09/382,512

(22) Filed: Aug. 25, 1999

(51) Int. Cl.$^7$ ................................................ H04Q 7/32
(52) U.S. Cl. ........................ 455/318; 455/303; 455/313; 455/316; 331/2
(58) Field of Search ................................ 455/296, 303, 455/550, 304, 310, 313, 314, 317, 318, 118, 323, 326, 316, 146; 331/2

(56) References Cited

U.S. PATENT DOCUMENTS

| | | | |
|---|---|---|---|
| 4,451,930 A | * | 5/1984 | Chapman et al. ............ 455/313 |
| 4,912,432 A | * | 3/1990 | Galani et al. .................. 331/2 |
| 5,761,615 A | | 6/1998 | Jaffee ............................ 455/314 |
| 6,181,212 B1 | * | 1/2001 | Khoini-Poorfard et al. . 455/314 |
| 6,192,225 B1 | * | 2/2001 | Arpaia et al. ................ 455/313 |
| 6,243,569 B1 | * | 6/2001 | Atkinson .................... 455/310 |

OTHER PUBLICATIONS

IBM Advances; Silicon–Germanium 3–V PCS–Band: GSM Tri–Band VCO; IBM Corporation; Aug., 1998.
Philips Semiconductors Product Specification; Low Voltage IF I/Q Transceiver SA1638; Figure 1. SA1638 Pin Configuration and Figure 2. SA1638 Block Diagram.
Proceeding of IRE; Fractional–Frequency Generators Utilizing Regenerative Modulation by R.L Miller, pp. 446–455.

* cited by examiner

Primary Examiner—William Trost
Assistant Examiner—Keith Ferguson
(74) Attorney, Agent, or Firm—Samuels, Gauthier & Stevens, LLP

(57) ABSTRACT

A local oscillator apparatus is disclosed for use in radio frequency communication systems. The local oscillator apparatus comprises at least one mixer coupled to an oscillator input signal and to a feedback signal such that a local oscillator signal may be produced by fractional multiplication of the oscillator input signal. In an embodiment of the invention, the local oscillator apparatus includes a regenerative modulator comprising a pair of frequency dividers and a single side band mixer.

8 Claims, 2 Drawing Sheets

LOCAL OSCILLATOR APPARATUS FOR RADIO FREQUENCY COMMUNICATION SYSTEMS

BACKGROUND OF THE INVENTION

The present invention generally relates to receivers and transmitters for radio frequency (RF) signals, and particularly relates to local oscillators for radio frequency signal receivers.

Local oscillator signals are employed in radio frequency signal receivers, such as direct conversion receivers. A direct conversion receiver mixes down to an intermediate frequency of zero Hertz, and is therefore sometimes referred to as a zero IF receiver. The modulation information only is represented in the down conversion, and there is no carrier information that is typically associated with an intermediate frequency. In a direct conversion receiver the local oscillator signal is operating at the same frequency as the input RF signal. U.S. Pat. Nos. 5,438,692 and 5,548,068 disclose conventional direct conversion receivers.

In direct conversion, the modulation information is preserved through quadrature down conversion, which involves mixing the incoming line or carrier with a local oscillator signal along two different paths. The local oscillator signal along one path may be at zero phase (0°) with respect to the input RF signal, and may be phase shifted to 90° along the other path. Alternatively, one path may be at −45° while the other is at +45° with respect to the input signal. See for example, U.S. Pat. No. 5,303,417. In any event, the circuit paths are typically mutually 90° different in phase, and one path is referred to as the in-phase (I) channel while the other is referred to as the quadrature (Q) channel. The quadrature down conversion method preserves the necessary phase information within the input signal.

As shown in FIG. 1, a conventional radio frequency receiver includes an input port 10 for receiving an input RF signal from an RF antenna includes a local oscillator 22. The input signal is divided between two input paths. The input signal in one input path is mixed at mixer 12 with the local oscillator signal 14 at zero degrees phase shift. The input signal in the other input path is mixed at mixer 16 with the local oscillator signal at 90° phase shift. The 90° phase shift in the local oscillator signal is achieved by phase shift device 20. The local oscillator signal is produced by voltage controlled oscillator (VCO) 22.

Interference may occur if the local oscillator signal couples to the input RF signal. Because the frequencies of these signals are the same, the local oscillator signal cannot be frequency filtered from the incoming signal. The incoming signal would, in effect, be blocked. U.S. Pat. Nos. 4,811,425 and 5,428,837 are directed to reducing the effects of leakage of local oscillator signals to RF input signals in zero IF receivers.

Moreover, interference may occur if the RF input signal radiates to the VCO. Since VCOs are typically very sensitive, any signal that is close in frequency to the frequency of the VCO may interact with it, even if the signal comprises only a small amount of energy. This is because the VCO will selectively amplify signals at or near its frequency.

One way of overcoming this problem is to employ a VCO that operates at a frequency different than the input RF signal. The frequency of the VCO signal is then modified to produce a local oscillator signal at the same frequency as the input RF signal. For example, two VCOs could be employed together with a mixer. The signal from one VCO (at frequency $F_1$) may be combined with the signal from another VCO (at frequency $F_2$) by the mixer. The product, however, of the $F_1$ and $F_2$ signals, will include spurious signals that must be filtered out to produce the local oscillator signal. For example, the product of two sine functions $\sin(\alpha) \times \sin(\beta)$ equals $\frac{1}{2}\cos(\alpha-\beta) - \frac{1}{2}\cos(\alpha+\beta)$. Two frequencies would be produced at the mixer ($F_1+F_2$ and $F_1-F_2$), and one would have to be filtered out. It is typically necessary to do this type of filtering off IC, which further invites interference or leakage of the local oscillator signal to the input RF signal.

In other conventional local oscillator circuits, one VCO only might be employed and the output of the VCO would be input to a frequency doubler, then to a bandpass filter, and finally to the phase shift device 20. The frequency of the VCO ($F_1$) could be one half the frequency of the RF input signal, and the frequency of the local oscillator would then be $2F_1$. In further conventional local oscillator circuits, the frequency of the VCO ($F_1$) could be twice the frequency of the RF input signal, and the frequency of the local oscillator signal may be equal to $\frac{1}{2}F_1$. This could also be achieved with one VCO ($F_1$), whose output could be input to a one-half frequency divider to produce the local oscillator signal for input to the phase shift device 20. In each such circuit however, the local oscillator signal may still radiate to the RF input signal, and the VCO may be sensitive to harmonic frequencies of the RF input signal.

Such conventional techniques do not fully alleviate the interference problems. It is an object of the present invention to provide a local oscillator signal for radio frequency transmitters and receivers that has reduced leakage or interference between a radio frequency input signal and the local oscillator. It is also desirable to provide a local oscillator circuit that may be employed in an integrated circuit environment. It is further desirable to provide a local oscillator signal for dual band operation where one frequency band (e.g., 1800 MHz.) is twice the frequency of the other frequency band (e.g., 900 MHz.).

SUMMARY OF THE INVENTION

The invention provides a local oscillator apparatus for use in radio frequency communication systems. The local oscillator apparatus comprises at least one mixer coupled to an oscillator input signal and to a feedback signal such that a local oscillator signal may be produced by fractional multiplication of the oscillator input signal. In an embodiment of the invention, the local oscillator apparatus includes a regenerative modulator comprising a pair of frequency dividers.

BRIEF DESCRIPTION OF THE DRAWINGS

The following detailed description of the illustrated embodiments may be further understood with reference to the accompanying drawings in which.

DETAILED DESCRIPTION OF THE ILLUSTRATED EMBODIMENTS

Figure 1:
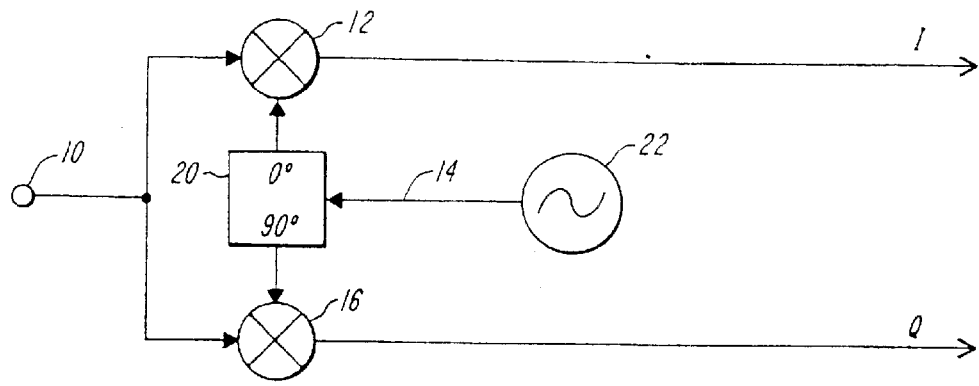
FIG. 1 shows a schematic representation of a radio frequency receiver including a conventional local oscillator.
Figure 2:
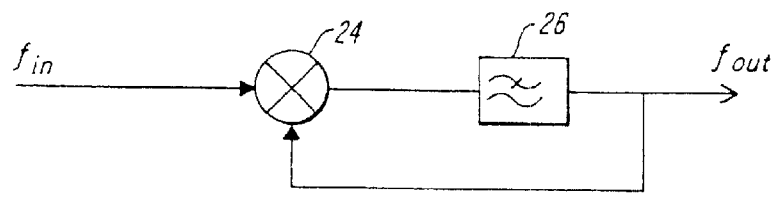
FIG. 2 shows a model of a prior art one half frequency divider using regenerative feedback.

The system of the illustrated embodiments is based on the model of a regenerative modulator that provides feedback to a mixer 24 as shown in FIG. 2. Such a system in a simplified form generally satisfies the relationship that $f_{in}-f_{out}=f_{out}$, which requires that $f_{out}=f_{in}/2$. This provides a divide by two function. Since the output signal of a mixer is a product of two input signals, both sum and difference terms are obtained in the output signal. For example, if the input signals are $\cos(\omega_i t+\theta)$ and $\cos(\omega_{LO} t)$, the output signal is ½ $\cos((\omega_i+\omega_{LO})t+\theta)+$½ $\cos((\omega_i-\omega_{LO})t+\theta)$ where $\theta$ represents an arbitrary phase relationship between the signals. The mixer product will include upper and lower side band components. To obtain correct operation as a divide by two, only the lower side band should be selected. This is the purpose of the low pass filter 26.

Figure 3:
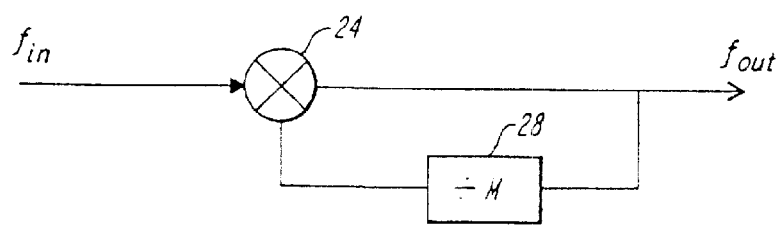
FIG. 3 shows a model of a prior art generalized frequency divider using regenerative feedback.

As shown in FIG. 3, a frequency divider 28 may be placed in the feedback path to the mixer 24. The frequency divider 28 provides a divide by m function. This model produces the more generalized response given by:

$$f_{out}=f_{in}[m/(m\pm 1)]$$

where (m−1) represents the selection of the upper side band signal, and (m+1) represents the selection of the lower side band signal.

The required upper or lower side band may be selected by a conventional bandpass filter as shown in FIG. 2, which would be placed between mixer 24 and divider 28 in FIG. 3. An alternative is to use a single sideband (SSB) mixer. Here, the conventional mixer 24 is replaced with an SSB mixer. The construction of SSB mixers is well known to those skilled in the art and may be arranged to select either the upper or lower side band as desired.

The use of fractional multiplication by regenerative principles has been found to be particularly useful in multi-band integrated circuit receivers where one of the bands is higher in frequency than the other band by approximately a factor of two. The system is also particularly useful for (although not exclusively for) direct conversion receivers. The present invention takes advantage of such a system wherein fractional multiplication of the local oscillator source is provided.

In a preferred embodiment in which we require local oscillator signals at 900 MHz and 1800 MHz the concept of fractional multiplication by regenerative action is used with a single local oscillator input at 1350 MHz operating halfway between the two outputs. A multiplication of ⅔ is provided for a 900 MHz output, and a multiplication of ⁴⁄₃ is provided for an 1800 MHz output.

Figure 4:
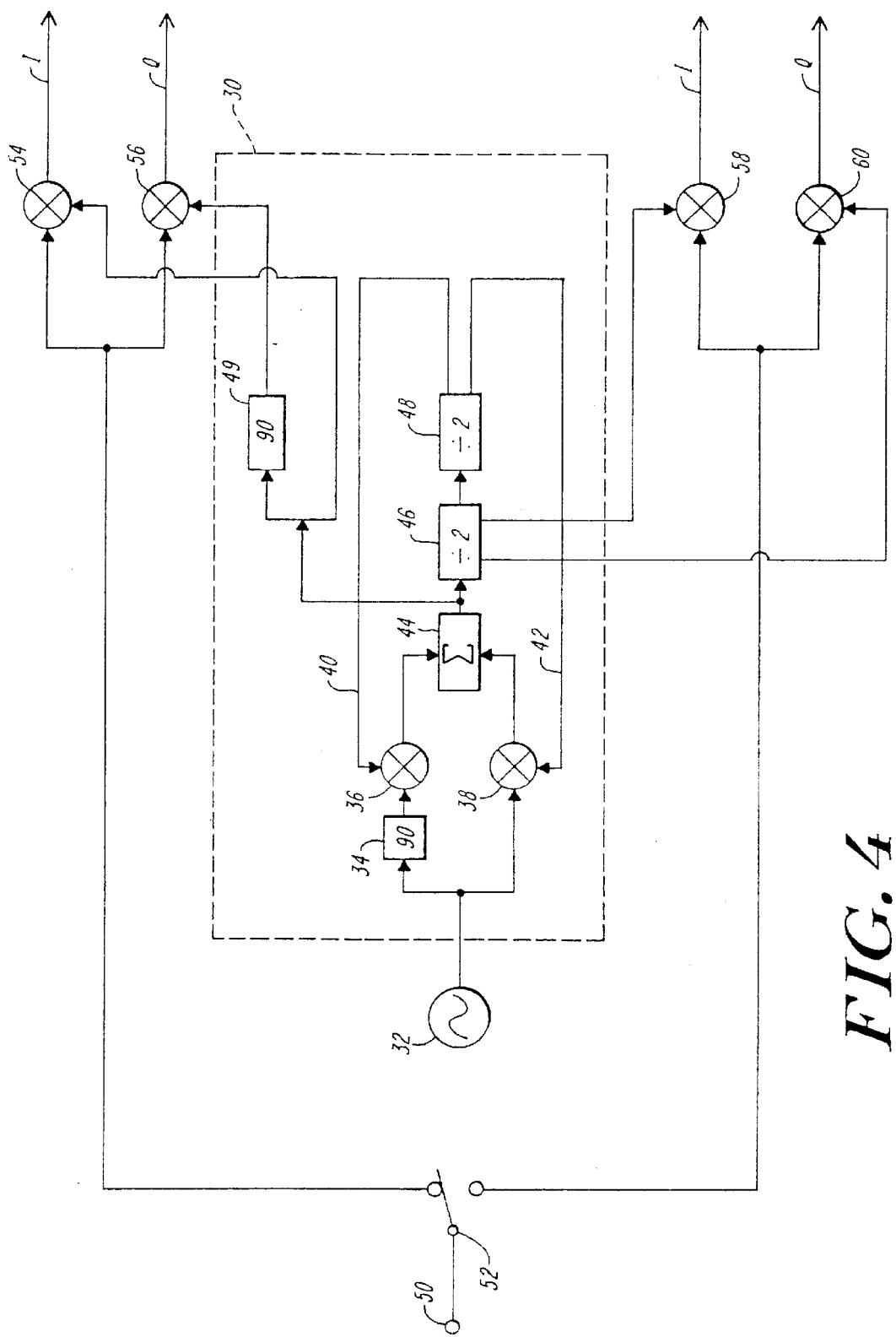
FIG. 4 shows a schematic representation of a local oscillator apparatus of the invention.

As shown in FIG. 4, a local oscillator circuit 30 of an embodiment of the invention receives an oscillator input signal from a VCO 32 or other main local oscillator source in the system (typically a frequency synthesiser). The oscillator input signal is divided between two channels, one of which includes a phase splitter 34 for producing a phase shift signal. The phase shifted signal is input to a first mixer 36, and the input signal without a phase shift is input to a second mixer 38. The outputs of the mixers 36 and 38 are input to a combiner 44.

The output of the combiner 44 is input to a first frequency divider 46, the output of which is input to a second frequency divider 48. Each frequency divider 46 and 48 conventionally includes master and slave elements from which output signals may be provided at 90° phase shift and 0° phase shift. The 90° phase shift output signal from the second frequency divider 48 provides the 90° phase shift feedback signal 40, and the 0° phase shift output signal from the second frequency divider 48 provides the 0° phase shift feedback signal 42. The frequency dividers 46 and 48 are each divide-by-two dividers. The phase splitter 34, mixers 36,38, and combiner 44 form a single side band mixer (SSB). One of the inputs to the SSB is driven by the divide-by-two divider 48 from which the necessary quadrature component may be readily extracted.

Again, the oscillator input signal may, for example be centered at 1350 MHz. The output signal for operation at 1800 MHz (e.g., for a digital cellular system or DCS) may be provided to mixers 54 and 56 where the signal is taken from the output of the combiner 44 and the quadrature component is provided by a phase splitter 49 as shown in FIG. 2. The output signal for operation at 900 MHz (e.g., for a global system for mobile communication GSM) may be provided to mixers 589 and 60 where the quadrature and in-phase portions of the signal are taken from the first frequency divider 46 as shown in FIG. 4. This significantly removes oscillator input to local oscillator coupling at the circuit board level, and restricts such coupling to the integrated circuit chip level, since the mixer local oscillators themselves must operate at the input frequency. In this way, the level of interaction may be reduced substantially through the use of well matched double balanced mixers, and fully differential local oscillator path and input signal paths, as well as the use of silicon substrates that provide a high level of isolation. A further advantage of the fractional relationship employed above is that the system is not sensitive to harmonics of the local oscillator or input frequencies interacting with one another since they are not related as integer multiples on one another.

FIG. 4 shows the local oscillator circuit as it may be used in a dual frequency radio frequency receiver. As shown in FIG. 4, a receiver input signal is received (from, for example an antenna) at a system input port 50 and switched at switch 52 between two paths (one for each mode of operation, e.g., DCS and GSM). In DCS operation, the receiver input signal is coupled to mixers 54 and 56 for producing I and Q channel mixed input signals. In GSM operation, the receiver input signal is coupled to mixers 58 and 60 for producing I and Q channel mixed input signals.

For an oscillator input at 1350 MHz the frequency that is produced by the combiner 44 is 1800 MHz, and the frequency of each of the feedback signals 40 and 42 is 450 MHz. Since the divide-by-four function is provided by two successive divide-by-two dividers (46 and 48), the lower band of operation (e.g., GSM) is provided by the output of the first divider 46 as shown in FIG. 4. The outputs for the upper band of operation (e.g., DCS) is provided at the output of the combiner 44.

The above system provides that the frequency of the oscillator input signal will be multiplied, and that the channel spacing will also be multiplied. In operation, therefore, the step size on the frequency synthesizer (the local input oscillator) must be 150 KHz for the 1800 MHz band, and 300 KHz for the 900 MHz band to achieve a 200 KHz step size on the final output. One method of achieving this is a practical system is the use of a fractional-N sythesizer. Some of the benefits of the invention are also applicable to receivers with low intermediate frequencies (or low-IF), for direct conversion transmitter circuits and for multi-band radio systems generally. Systems of the invention also provide relatively lower power consumption, lower noise, lower complexity, and lower spurious output signals.

Those skilled in the art will be appreciated that numerous modifications and variations may be made to the above disclosed embodiments without departing from the spirit and scope of the invention.

What is claimed is:

1. A local oscillator apparatus for use in radio frequency communication systems, said local oscillator apparatus comprising:

a plurality of mixers, each of which is coupled to an oscillator input signal and a plurality of feedback paths, and a plurality of feedback signals associated with said plurality of feedback paths so that a local oscillator signal may be produced by fractional multiplication of the oscillator input signal, said feedback signals are coupled to a first frequency divider.

2. A local oscillator apparatus as claimed in claim 1, wherein said first frequency divider is coupled to a second frequency divider.

3. A regenerative modulator for use in a local oscillator apparatus for use in radio frequency communications systems, said regenerative modulator comprising:

a pair of quadrature related mixers, each of said mixers being coupled to an oscillator input signal and to first and second feedback paths respectively; and modulation means coupled to each of said first and second feedback paths, and coupled to each of said mixers, said modulation means for modulating said signal such that a pair of quadrature related local oscillator signals may be produced by fractional multiplication of the oscillator input signal.

4. A regenerative modulator as claimed in claim 3, wherein said modulation means includes a pair of frequency dividers.

5. A regenerative modulator as claimed in claim 3, wherein said modulation means further provides that two pairs of quadrature related local oscillator signals may be produced by fractional multiplication of the oscillator input signal.

6. A regenerative modulator as claimed in claim 5, wherein said two pairs of quadrature related local oscillator signals permit dual band frequency operation at digital cellular system (DCS) and global system for mobile communication (GSM) frequencies.

7. A regenerative modulator for use in a local oscillator apparatus for radio frequency communications systems, said regenerative modulator comprising:

a first quadrature related mixer coupled to an oscillator input signal via a phase shifter and coupled to a first feedback path;

a second quadrature related mixer coupled to the oscillator input signal and to a second feedback path;

a combiner for combining the output signals from said first and second mixers to produce a combined signal; and a modulator coupled to said combiner and to said feedback paths, said modulator for modulating said combined signal to produce a modulated combined signal, said regenerative modulator providing that a first pair of quadrature related local oscillator signals may be produced responsive to said combined signal, and a second pair of quadrature related local oscillator signals may be produced responsive to said modulator.

8. A regenerative modulator as claimed in claim 7, wherein said first pair of quadrature related local oscillator signals permits operation at digital cellular system (DCS) frequencies, and said second pair of quadrature related local oscillator signals permits operation at global system for mobile communication (GSM) frequencies.

* * * * *